(12) United States Patent
Park

(10) Patent No.: US 10,096,371 B2
(45) Date of Patent: Oct. 9, 2018

(54) DATA STORAGE DEVICE AND OPERATING METHOD THEREOF

(71) Applicant: SK hynix Inc., Gyeonggi-do (KR)

(72) Inventor: Jeen Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/613,744

(22) Filed: Jun. 5, 2017

(65) Prior Publication Data

US 2018/0226131 A1 Aug. 9, 2018

(30) Foreign Application Priority Data

Feb. 6, 2017 (KR) .......................... 10-2017-0016212

(51) Int. Cl.
  *G11C 5/14* (2006.01)
  *G11C 16/34* (2006.01)
  *G11C 16/32* (2006.01)

(52) U.S. Cl.
  CPC ............ *G11C 16/3459* (2013.01); *G11C 5/14* (2013.01); *G11C 5/148* (2013.01); *G11C 16/32* (2013.01)

(58) Field of Classification Search
  CPC .................................. G11C 5/148; G11C 5/14
  USPC ............................................................ 365/228
  See application file for complete search history.

(56) References Cited

U.S. PATENT DOCUMENTS

| | | | | |
|---|---|---|---|---|
| 6,101,611 A | * | 8/2000 | Yoshida | G06F 1/30 320/132 |
| 7,213,120 B2 | * | 5/2007 | Hotaka | G11C 16/225 710/200 |
| 7,362,143 B2 | * | 4/2008 | O'Keeffe | G06F 1/28 327/143 |

FOREIGN PATENT DOCUMENTS

KR 1020040015545 2/2004

* cited by examiner

*Primary Examiner* — Son Mai
(74) *Attorney, Agent, or Firm* — IP & T Group LLP

(57) ABSTRACT

A data storage device includes a nonvolatile memory device; a voltage detector suitable for detecting an operating voltage of the nonvolatile memory device; and a control unit suitable for making a first determination whether the operating voltage is dropped intentionally or unintentionally based on a first reference time and an elapsed time for which the operating voltage decreases from a first reference voltage to a second reference voltage.

16 Claims, 9 Drawing Sheets

DATA STORAGE DEVICE AND OPERATING METHOD THEREOF

CROSS-REFERENCES TO RELATED APPLICATION

The present application claims priority under 35 U.S.C. § 119(a) to Korean application number 10-2017-0016212, filed on Feb. 6, 2017, in the Korean Intellectual Property Office, which is incorporated herein by reference in its entirety.

BACKGROUND

1. Technical Field

Various embodiments generally relate to a data storage device which uses a nonvolatile memory device as a storage medium.

2. Related Art

Recently, the paradigm for the computer environment has been converted into ubiquitous computing so that computer systems can be used anytime and anywhere. Due to this, use of portable electronic devices such as mobile phones, digital cameras, and notebook computers has rapidly increased. In general, such portable electronic devices use a data storage device which uses a memory device. A data storage device is used to store data to be used in a portable electronic device.

A data storage device using a memory device provides advantages in that, since there is no mechanical driving part, stability and durability are excellent, an information access speed is high and power consumption is small. Data storage devices having such advantages include a universal serial bus (USB) memory device, memory cards having various interfaces, a universal flash storage (UFS) device, and a solid state drive (SSD).

SUMMARY

Various embodiments are directed to a data storage device capable of determining whether an operating voltage of a nonvolatile memory device is dropped intentionally or unintentionally, and an operating method thereof.

In an embodiment, a data storage device may include: a nonvolatile memory device; a voltage detector suitable for detecting an operating voltage of the nonvolatile memory device; and a control nit suitable for making a first determination whether the operating voltage is dropped intentionally or unintentionally based on a first reference time and an elapsed time for which the operating voltage decreases from a first reference voltage to a second reference voltage.

In an embodiment, a method for operating a data storage device which stores data in a nonvolatile memory device may include: determining whether an operating voltage of the nonvolatile memory device is dropped to be equal to or lower than a first reference voltage; determining, in the case where the operating voltage is dropped to be equal to or lower than the first reference voltage, whether an elapsed time for which the operating voltage is dropped from the first reference voltage to a second reference voltage is shorter than a first reference time; determining, in the case where the elapsed time is shorter than the first reference time, whether a holding time for which the operating voltage is held equal to or lower than the second reference voltage is longer than a second reference time; and determining, in the case where the holding time is longer than the second reference time, that the operating voltage is intentionally dropped.

According to the embodiments, it is possible to determine whether an operating voltage of a nonvolatile memory device is intentionally dropped or unintentionally dropped.

BRIEF DESCRIPTION OF THE DRAWINGS

The above and other features and advantages of the present invention will become more apparent to those skilled in the art to which the present invention pertains by the following detailed description with reference to the attached drawings in which.

DETAILED DESCRIPTION

Figure 1:
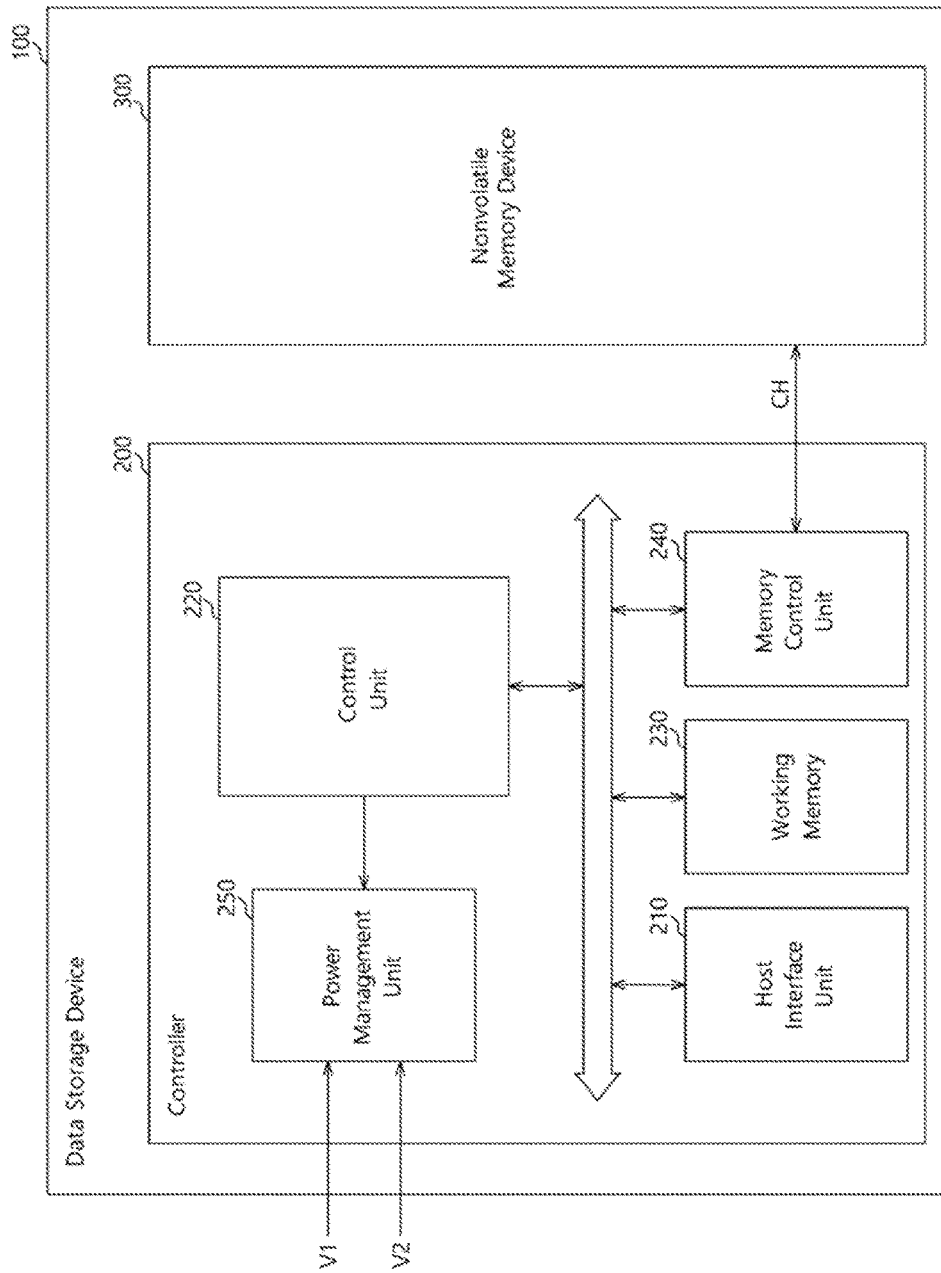
FIG. 1 is a block diagram illustrating a data storage device in accordance with an embodiment of the present invention.

In the present invention, advantages, features and methods for achieving them will become more apparent after a reading of the following exemplary embodiments taken in conjunction with the drawings. The present invention may, however, be embodied in different forms and should not be construed as being limited to the embodiments set forth herein. Rather, these embodiments are provided to describe the present invention in detail to the extent that a person skilled in the art to which the invention pertains can easily enforce the technical concept of the present invention.

It is to be understood herein that embodiments of the present invention are not limited to the particulars shown in the drawings and that the drawings are not necessarily to scale and in some instances proportions may have been exaggerated in order to more clearly depict certain features of the invention. While particular terminology is used herein, it is to be appreciated that the terminology used herein is for the purpose of describing particular embodiments only and is not intended to limit the scope of the present invention.

As used herein, the term "and/or" includes any and all combinations of one or more of the associated listed items.

It will be understood that when an element is referred to as being "on," "connected to" or "coupled to" another element it may be directly on, connected or coupled to the other element or intervening elements may be present. As used herein, a singular form is intended to include plural forms as well, unless the context clearly indicates otherwise. It will be further understood that the terms "includes" and/or "including," when used in this specification, specify the presence of at least one stated feature, step, operation, and/or element, but do not preclude the presence or addition of one or more other features, steps, operations, and/or elements thereof.

Hereinafter, a data storage device and an operating method thereof will be described below with reference to the accompanying drawings through various examples of embodiments.

FIG. 1 is a block diagram illustrating a data storage device 100 in accordance with an embodiment of the present invention.

The data storage device 100 may store data to be accessed by a host device (not shown) such as a mobile phone, an MP3 player, a laptop computer, a desktop computer, a game player, a TV, an in-vehicle infotainment system, and so forth. The data storage device 100 may also be referred to as a memory system.

The data storage device 100 may be manufactured as any one of various storage devices depending on a standard transmission protocol that is coupled with the host device. For example, the data storage device 100 may be configured as any one of various storage devices such as a solid state drive, a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, a memory stick, and so forth.

The data storage device 100 may be manufactured as any one among various packages. For example, the data storage device 100 may be manufactured as any one of various package such as a package-on-package (POP), a system-in-package (SIP), a system-on-chip (SOC), a mufti-chip package (MCP), a chip-on-board (COB), a wafer-level fabricated package (WFP) and a wafer-level stack package (WSP).

The data storage device 100 may include a controller 200. The controller 200 may include a host interface unit 210, a control unit 220, a working memory 230, a memory control unit 240, and a power management unit 250.

The host interface unit 210 may interface the host device and the data storage device 100. For example, the host interface unit 210 may communicate with the host device by using a host interface, that is, any one among standard transmission protocols such as universal serial bus (USB), universal flash storage (UFS), multimedia card (MMC), parallel advanced technology attachment (RATA), serial advanced technology attachment (SATA), small computer system interface (SCSI), serial attached SCSI (SAS), peripheral component interconnection (PCI) and PCI express (PCI-E) protocols.

The control unit 220 may control general operations of the controller 200. The control unit 220 may drive an instruction or an algorithm of a code type, that is, a software, loaded in the working memory 230, and may control the operations of the internal function blocks of the controller 200. The control unit 220 may include a function block needed for driving of a software, for example, a timer 221. The control unit 220 may be configured by a micro control unit (MCU) or a central processing unit (CPU).

The working memory 230 may store a software to be driven by the control unit 220. Also, the working memory 230 may store data needed to drive the software. The working memory 230 may be configured by a random access memory such as a dynamic random access memory (DRAM) or a static random access memory (SRAM).

The memory control unit 240 may control a nonvolatile memory device 300 according to control of the control unit 220. The memory control unit 240 may also be referred to as a memory interface unit. The memory control unit 240 may provide control signals to the nonvolatile memory device 300 for controlling the nonvolatile memory device 300. The control signals may include a command an address, a control signal and so forth. The memory control unit 240 may provide data to the nonvolatile memory device 300 or may be provided with the data read out from the nonvolatile memory device 300.

The power management unit 250 may be configured by a power supply, a power management integrated circuit (PMIC), or the like. The power management unit 250 may manage power used in the operation of the data storage device 100. The power management unit 250 may manage power modes (for example, a normal mode and a power-saving mode) of the data storage device 100 according to control of the control unit 220. Also, the power management unit 250 may distribute an operating voltage provided from an external device, for example, the host device, depending on a power mode.

For example, the power management unit 250 may provide a first operating voltage V1 and a second operating voltage V2 to the inside of the data storage device 100. The power management unit 250 may provide the internal blocks 210 to 240 of the controller 200 through power lines (not shown) with the first operating voltage V1 needed for the operation of the controller 200. Further the power management unit 250 may provide the nonvolatile memory device 300 through power lines (not shown) with the second operating voltage V2 needed for the operation of the nonvolatile memory device 300.

The data storage device 100 may include the nonvolatile memory device 300. The nonvolatile memory device 300 may be coupled with the controller 200 through a channel CH. Channel CH may be a signal line or a plurality of signal lines, capable of transmitting a command, an address, control signals and data. The nonvolatile memory device 300 may be used as the storage medium of the data storage device 100.

The nonvolatile memory device 300 may be configured by any one of various nonvolatile memory devices such as a NAND flash memory device, a NOR flash memory device, a ferroelectric random access memory (FRAM) using a ferroelectric capacitor, a magnetic random access memory (MRAM) using a tunneling magneto-resistive (TMR) layer, a phase change random access memory (PCRAM) using a chalcogenide alloy, and a resistive random access memory (RERAM) using a transition metal oxide. The ferroelectric random access memory (FRAM), the magnetic random access memory (MRAM), the phase change random access memory (PCRAM) and the resistive random access memory (RERAM) are nonvolatile random access memory devices capable of random access to memory cells. The nonvolatile memory device 300 may be configured by a combination of a NAND flash memory device and at least one of the above-described various types of nonvolatile random access memory devices.

Figure 2:
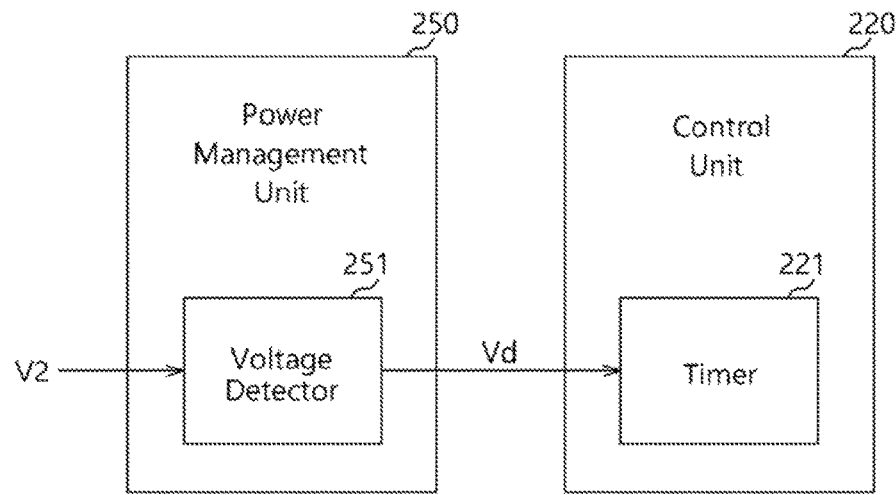
FIG. 2 is a block diagram illustrating a power management unit and a control unit in accordance with an embodiment of the present invention.

FIG. 2 is a block diagram illustrating the power management unit 250 and the control unit 220 in accordance with an embodiment of the present invention.

The power management unit 250 may include a voltage detector 251. The voltage detector 251 may detect the voltage level of the second operating voltage V2. The voltage detector 251 may provide the detected voltage level of the second operating voltage V2 to the control unit 220. For example, the voltage detector 251 may convert the voltage level of the second operating voltage V2 from an analog value to a digital value, and provide the control unit 220 with a voltage level Vd of the second operating voltage V2 converted into a digital value.

The control unit 220 may include the timer 221. The timer 221 may measure or count a time according to control of the control unit 220.

The control unit 220 may determine whether the second operating voltage V2 is dropped intentionally or unintentionally, based on the voltage level Vd of the second operating voltage V2 provided from the voltage detector 251 and the measured time of the timer 221. An intentional drop of the second operating voltage V2 means a state of the data storage device 100 in which the external device, for example, the host device, which provides the second operating voltage V2, drops or cuts off the second operating voltage V2 because of necessity. Conversely, the second operating voltage V2 which is unintentionally dropped may represent a sudden power interruption state of the data storage device 100 that is not intended by the host device.

A determining operation of the control unit 220 may include a first determining operation and a second determining operation, and the control unit 220 may perform the second determining operation when it is determined by the first determining operation that the second operating voltage V2 is intentionally dropped. The first determining operation of the control unit 220 will be described below with reference to FIG. 3, and the second determining operation of the control unit 220 will be described below with reference to FIG. 4.

Figure 3:
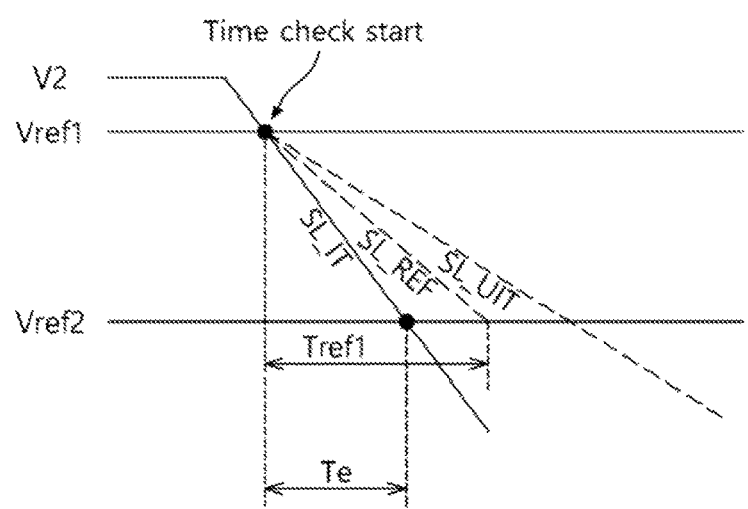
FIG. 3 is a diagram illustrating a first determining operation of the control unit in accordance with an embodiment of the preset invention.

FIG. 3 is a diagram illustrating the first determining operation of the control unit 220 in accordance with an embodiment of the present invention.

The values of a first reference voltage Vref1, a second reference voltage Vref2 and a first reference time Tref1 shown in FIG. 3 may be set in advance by the control unit 220. If the second operating voltage V2 is changed depending on the kind of the nonvolatile memory device 300, the first reference voltage Vref1, the second reference voltage Vref2 and the first reference time Tref1 may be changed accordingly.

The first reference voltage Vref1, the second reference voltage Vref2 and the first reference time Tref1 may define a reference slope SL_REF, as illustrated in FIG. 3.

The reference slope SL_REF may be determined by voltage decrease amount (that is, a voltage decrease amount from the first reference voltage Vref1 to the second reference voltage Vref2) for the first reference time Tref1. The control unit 220 may start a time check when the second operating voltage V2 becomes the same as the first reference voltage Vref1, measure an elapsed time Te until the second operating voltage V2 becomes the same as the second reference voltage Vref2, and determine the voltage drop slope of the second operating voltage V2 for the elapsed time Te.

The control unit 220 may determine whether the second operating voltage V2 is dropped intentionally or unintentionally, based on the voltage drop slope of the second operating voltage V2. For example, in the case where the voltage drop slope of the second operating voltage V2 is larger than the reference slope SL_REF (that is, in the case where the second operating voltage V2 abruptly decreases as in a slope SL_IT), the control unit 220 may determine that the second operating voltage V2 is intentionally dropped. Conversely, in the case where the voltage drop slope of the second operating voltage V2 is smaller than the reference slope SL_REF (that is, in the case where the second operating voltage V2 gently decreases as in a slope SL_UIT), the control unit 220 may determine that the second operating voltage V2 is unintentionally dropped.

In other words, the control unit 220 may determine whether the second operating voltage V2 is dropped intentionally or unintentionally based on the elapsed time Te for which the second operating voltage V2 decreases from the first reference voltage Vref1 to the second reference voltage Vref2. For example, in the case where the elapsed time Te is shorter than the first reference time Tref1, which means that the voltage drop slope of the second operating voltage V2 is larger than the reference slope SL_REF such as the slope SL_IT in FIG. 3, the control unit 220 may determine that the second operating voltage V2 is intentionally dropped. Conversely, in the case where the elapsed time Te is longer than the first reference time Tref1, which means that the voltage drop slope of the second operating voltage V2 is smaller than the reference slope SL_REF such as the slope SL_UIT in FIG. 3, the control unit 220 may determine that the second operating voltage V2 is unintentionally dropped.

Figure 4:
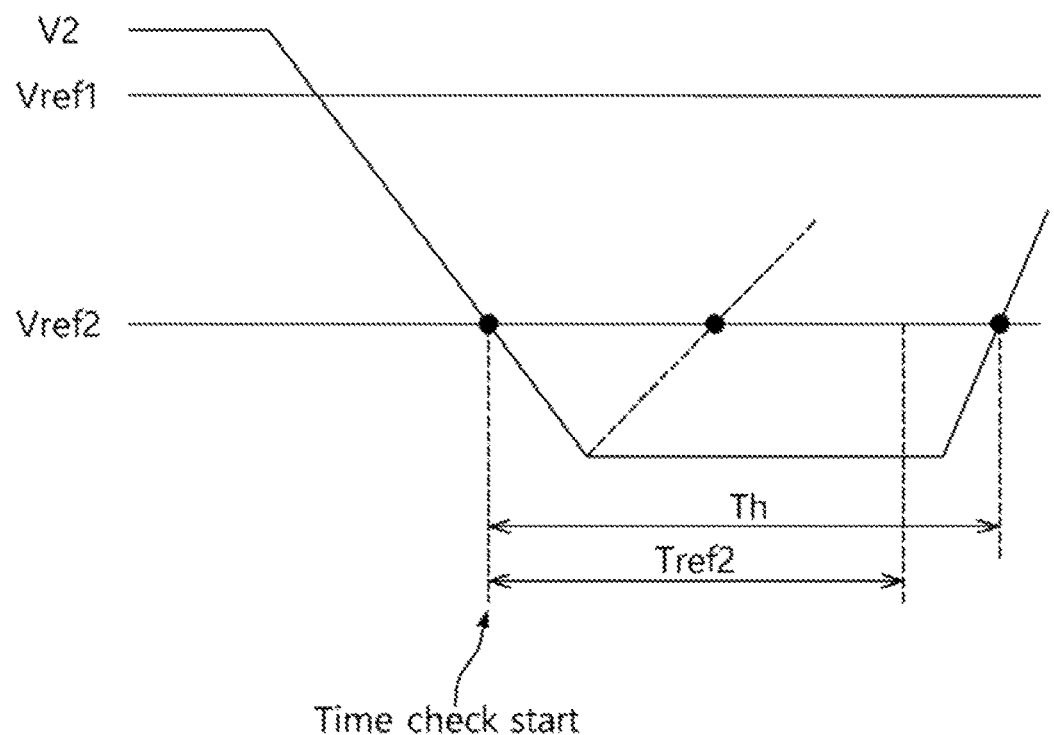
FIG. 4 is a diagram illustrating a second determining operation of the control unit in accordance with an embodiment of the present invention.

FIG. 4 is a diagram illustrating the second determining operation of the control unit 220 in accordance with an embodiment of the present invention.

As described above, the second determining operation may be performed in the case where it is determined by the first determining operation that the second operating voltage V2 is intentionally dropped. The second determining operation may be performed to check once again whether the second operating voltage V2 is intentionally dropped. Hence, in the case where a primary determination result by the first determining operation and a secondary determination result by the second determining operation are the same, it may be determined finally that the second operating voltage V2 is intentionally dropped.

The control unit 220 may start a time check when the second operating voltage V2 becomes the same as the second reference voltage Vref2 and measure a holding time Th for which the second operating voltage V2 is kept equal to or lower than the second reference voltage Vref2.

The control unit 220 may determine whether the second operating voltage V2 is dropped intentionally or unintentionally, based on the holding time Th. For example, in the case where the holding time Th is longer than a second reference time Tref2, the control unit 220 may determine that the second operating voltage V2 is intentionally dropped. Conversely, in the case where the holding time Th is shorter than the second reference time Tref2, the control unit 220 may determine that the second operating voltage V2 is unintentionally dropped. For example, as shown by the dotted line in FIG. 4, in the case where the second operating voltage V2 increases to be equal to higher than the second reference voltage Vref2 before the second reference time Tref2 elapses, the control unit 220 may determine that the second operating voltage V2 is unintentionally dropped.

Figure 5:
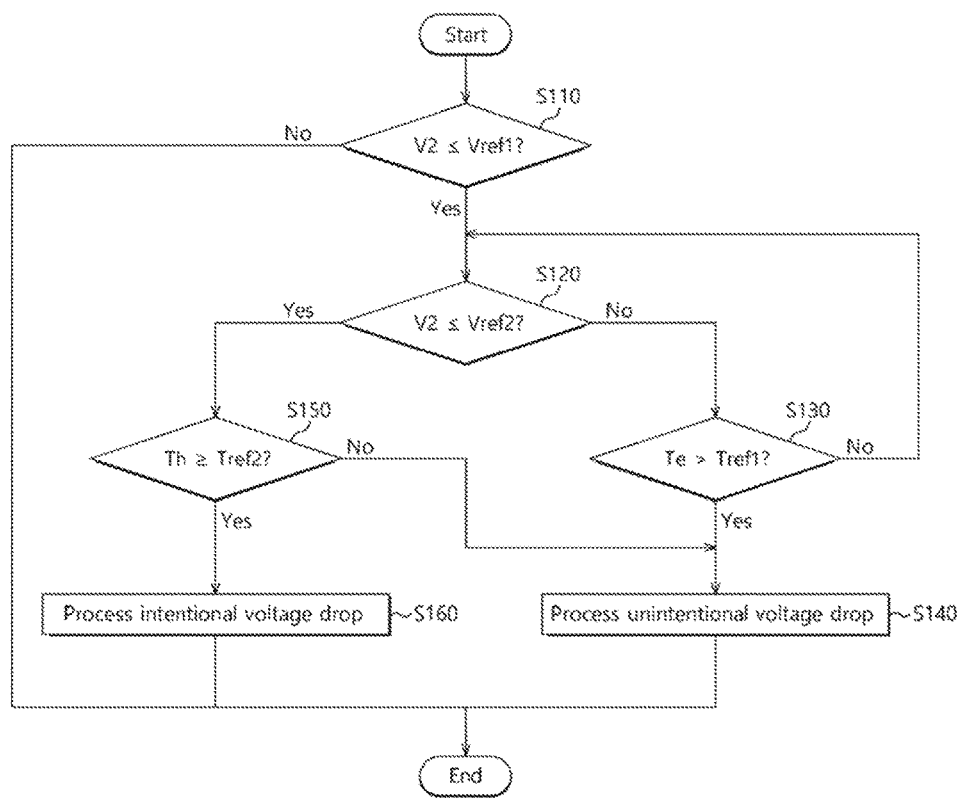
FIG. 5 is a flow chart illustrating a determining operation of the control unit in accordance with an embodiment of the present invention.

FIG. 5 is a flow chart illustrating the determining operation of the control unit in accordance with an embodiment of the present invention.

The first determining operation and the second determining operation of the control unit 220 described above with reference to FIGS. 3 and 4 may be configured by the following steps.

At step S110, the control unit 220 may determine whether the second operating voltage V2 is equal to or lower than the first reference voltage Vref1. In the case where the second operating voltage V2 exceeds the first reference voltage Vref1 ("No" at step S110), the process may be ended. In the case where the second operating voltage V2 is equal to or lower than the first reference voltage Vref1 ("Yes" at step S110), the process may proceed to step S120.

At the step S120, the control unit 220 may determine whether the second operating voltage V2 is equal to or lower than the second reference voltage Vref2. In the case where the second operating voltage V2 exceeds the second reference voltage Vref2 ("No" at step S120), since it is meant that the second operating voltage V2 is lower than the first reference voltage Vref1 and is higher than the second reference voltage Vref2, the elapsed time Te may be checked as in step S130.

At the step S130, the control unit 220 may determine whether the elapsed time Te exceeds the first reference time Tref1. In the case where the elapsed time Te exceeds the first reference time Tref1 ("Yes" at step S130), the control unit 220 may determine that the second operating voltage V2 is unintentionally dropped. Therefore as in step S140, the control unit 220 may perform an operation for processing an unintentional voltage drop.

In order to process the unintentional voltage drop, the control unit 220 may notify the host device that the second operating voltage V2 is dropped, and follow a host device-leading recovery procedure. If the host device-leading recovery procedure is performed, the control unit 220 may initialize the nonvolatile memory device 300 according to an initialization command or an initialization signal provided from the host device, and be provided again with a request which is uncompleted (or a request which is uncompleted and data corresponding to the request), from the host device.

In order to process the unintentional voltage drop, the control unit 220 may perform a recovery procedure by itself without involvement of the host device (hereinafter, referred to as a data storage device-leading recovery procedure). If the data storage device-leading recovery procedure is performed, the control unit 220 may initialize the nonvolatile memory device 300, and reprocess a request from the host device, which is unprocessed. For example, the control unit 220 may repeat a write request by storing write data in the nonvolatile memory device 300, or repeat a read request by providing data read out from the nonvolatile memory device 300, to the host device.

Referring back to the step S120, in the case where the second operating voltage V2 is equal to or lower than the second reference voltage Vref2 ("Yes" at step S120), since it is meant that the second operating voltage V2 is dropped from the first reference voltage Vref1 to the second reference voltage Vref2 within the first reference time Tref1, the process may proceed to step S150.

At the step S150, the control unit 220 may determine whether the holding time Th is equal to or longer than the second reference time Tref2. In the case where the holding time Th is shorter than the second reference time Tref2 ("No" at step S150), the control unit 220 may determine that the second operating voltage V2 is unintentionally dropped. Therefore, as in the step S140, the control unit 220 may perform an operation for processing an unintentional voltage drop. In the case where the holding time Th is equal to or longer than the second reference time Tref2 ("Yes" at step S150), the control unit 220 may determine that the second operating voltage V2 is intentionally dropped. Therefore, as in step S160, the control unit 220 may perform an operation for processing an intentional voltage drop.

In order to process the intentional voltage drop, the control unit 220 may initialize the nonvolatile memory device 300 and process a request which is newly received from the host device, after the second operating voltage V2 is recovered to a normal state (for example, after the second operating voltage V2 is stabilized to be equal to or higher than the first reference voltage Vref1).

Figure 6:
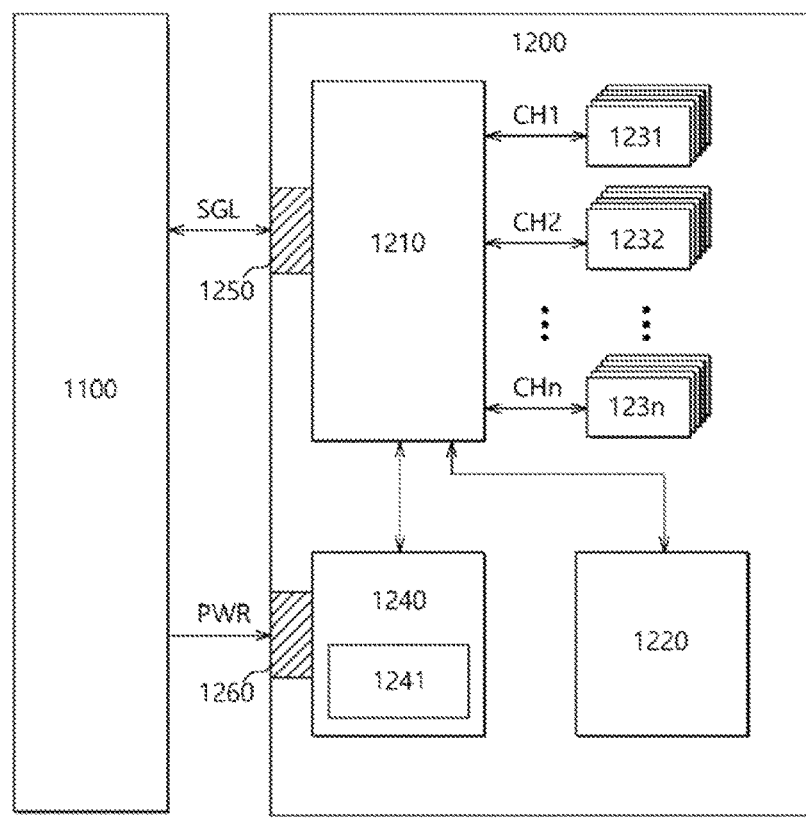
FIG. 6 is a diagram illustrating a data processing system including a solid state drive (SSD) in accordance with an embodiment of the present invention.

FIG. 6 is a diagram illustrating a data processing system including a solid state drive (SSD) in accordance with an embodiment of the present invention. Referring to FIG. 6, a data processing system 1000 may include a host device 1100 and a solid state drive (SSD) 1200.

The SSD 1200 may include a controller 1210, a buffer memory device 1220, nonvolatile memory devices 1231 to 123n, a power supply 1240, a signal connector 1250, and a power connector 1260.

The controller 1210 may control general operations of the SSD 1200.

The buffer memory device 1220 may temporarily store data to be stored in the nonvolatile memory devices 1231 to 123n. Further, the buffer memory device 1220 may temporarily store the data read out from the nonvolatile memory devices 1231 to 123n. The data temporarily stored in the buffer memory device 1220 may be transmitted to the host device 1100 or the nonvolatile memory devices 1231 to 123n according to control of the controller 1210.

The nonvolatile memory devices 1231 to 123n may be used as storage media of the SSD 1200. The nonvolatile memory devices 1231 to 123n may be coupled with the controller 1210 through a plurality of channels CH1 to CHn, respectively. One or more nonvolatile memory devices may be coupled to each channel. The nonvolatile memory devices coupled to each channel may be coupled to the same signal bus and data bus.

The power supply 1240 may provide power PWR inputted through the power connector 1260, to the inside of the SSD 1200. The power supply 1240 may include an auxiliary power supply 1241. The auxiliary power supply 1241 may supply power to allow the SSD 1200 to be normally terminated when a sudden power-off occurs. The auxiliary power supply 1241 may include large capacitance capacitors capable of charging power PWR.

The controller 1210 may exchange a signal SGL with the host device 1100 through the signal connector 1250. The signal SGL may include a command, an address, data, and so forth. The signal connector 1250 may be constructed by various types of connectors depending on an interface scheme between the host device 1100 and the SSD 1200.

Figure 7:
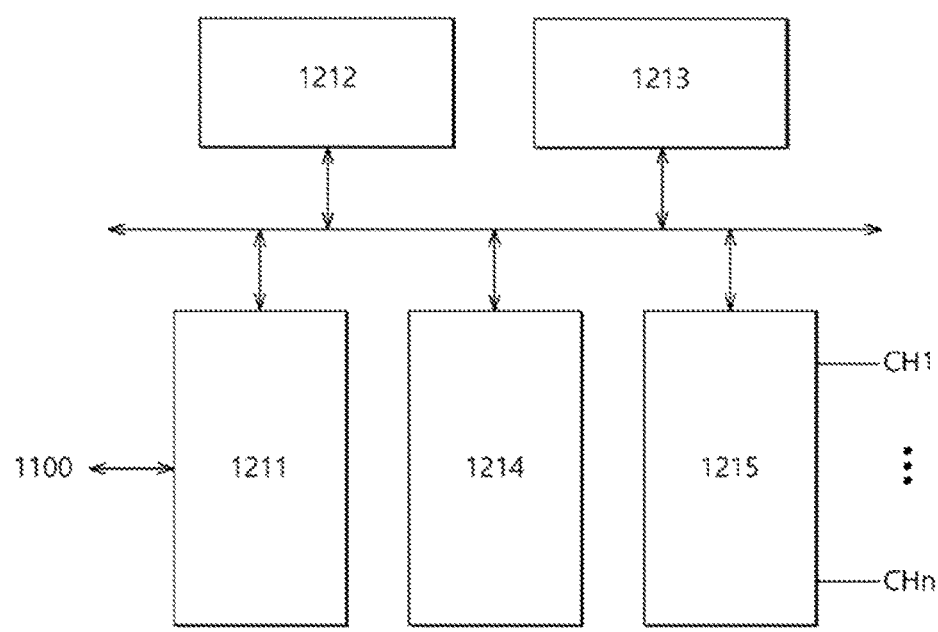
FIG. 7 is a diagram illustrating an exemplary configuration of the controller shown in FIG. 6.

FIG. 7 is a diagram illustrating an exemplary configuration of the controller shown in FIG. 6. Referring to FIG. 7, the controller 1210 may include a host interface unit 1211, a control unit 1212, a random access memory 1213, an error correction code (ECC) unit 1214, and a memory interface unit 1215.

The host interface unit 1211 may interface the host device 1100 and the SSD 1200 according to the protocol of the host device 1100. For example, the host interface unit 1211 may communicate with the host device 1100 through any one of secure digital, universal serial bus (USB), multimedia card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnection (PCI), PCI express (PCI-E) and universal flash storage (UFS) protocols. In addition, the host interface unit 1211 may perform a disk emulating function for supporting the host device 1100 to recognize the SSD 1200 as a general purpose data storage device, for example, a hard disk drive (HDD).

The control unit 1212 may analyze and process the signal SGL inputted from the host device 1100. The control unit 1212 may control operations of internal function blocks according to a firmware or a software for driving the SSD 1200. The random access memory 1213 may be used as a working memory for driving such a firmware or software.

The error correction code (ECC) unit 1214 may generate parity data of data to be transmitted to the nonvolatile memory devices 1231 to 123n. The generated parity data may be stored together with the data in the nonvolatile memory devices 1231 to 123n. The error correction code (ECC) unit 1214 may detect an error of the data read out from the nonvolatile memory devices 1231 to 123n, based on the parity data. If a detected error is within a correctable range, the error correction code (ECC) unit 1214 may correct the detected error.

The memory interface unit 1215 may provide control signals such as commands and addresses to the nonvolatile memory devices 1231 to 123n, according to control of the control unit 1212. Moreover, the memory interface unit 1215 may exchange data with the nonvolatile memory devices 1231 to 123n, according to control of the control unit 1212. For example, the memory interface unit 1215 may provide the data stored in the buffer memory device 1220, to the nonvolatile memory devices 1231 to 123n, or provide the data read out from the nonvolatile memory devices 1231 to 123n, to the buffer memory device 1220.

Figure 8:
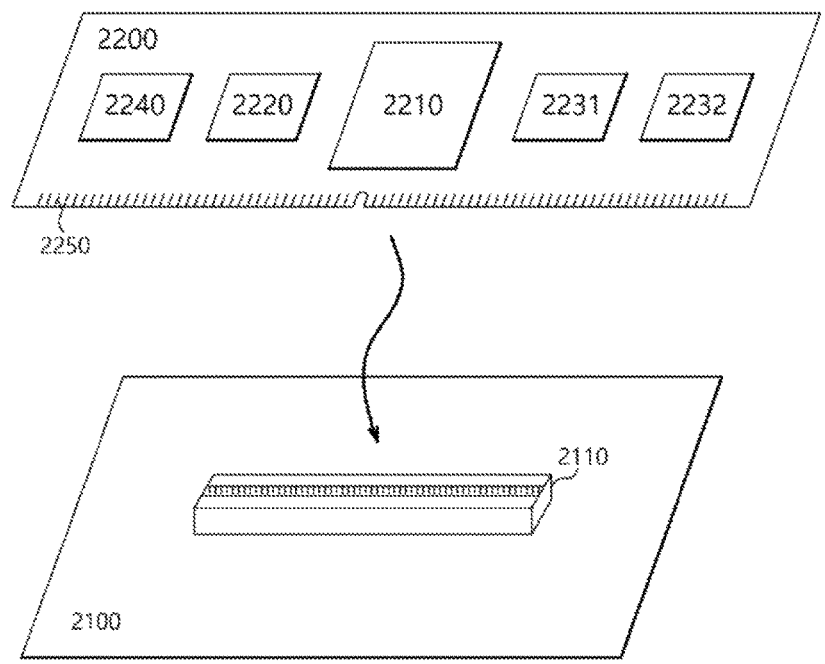
FIG. 8 is a diagram illustrating a data processing system including a data storage device in accordance with an embodiment of the present invention.

FIG. 8 is a diagram illustrating a data processing system including a data storage device in accordance with an embodiment of the present invention. Referring to FIG. 8, a data processing system 2000 may include a host device 2100 and a data storage device 2200.

The host device 2100 may be constructed in the form of a board such as a printed circuit board. Although not shown, the host device 2100 may include internal function blocks for performing the function of a host device.

The host device 2100 may include a connection terminal 2110 such as a socket, a slot or a connector. The data storage device 2200 may be mounted to the connection terminal 2110.

The data storage device 2200 may be constructed in the form of a board such as a printed circuit board. The data storage device 2200 may be referred to as a memory module or a memory card. The data storage device 2200 may include a controller 2210, a buffer memory device 2220, nonvolatile memory devices 2231 and 2232, a power management integrated circuit (PMIC) 2240, and a connection terminal 2250.

The controller 2210 may control general operations of the data storage device 2200. The controller 2210 may be configured in the same manner as the controller 1210 shown in FIG. 6.

The buffer memory device 2220 may temporarily store data to be stored in the nonvolatile memory devices 2231 and 2232. Further, the buffer memory device 2220 may temporarily store the data read out from the nonvolatile memory devices 2231 and 2232. The data temporarily stored in the buffer memory device 2220 may be transmitted to the host device 2100 or the nonvolatile memory devices 2231 and 2232 according to control of the controller 2210.

The nonvolatile memory devices 2231 and 2232 may be used as storage media of the data storage device 2200.

The PMIC 2240 may provide the power inputted through the connection terminal 2250, to the inside of the data storage device 2200. The PMIC 2240 may manage the power of the data storage device 2200 according to control of the controller 2210.

The connection terminal 2250 may be coupled to the connection terminal 2110 of the host device 2100. Through the connection terminal 2250, signals such as commands, addresses, data and so forth and power may be transferred between the host device 2100 and the data storage device 2200. The connection terminal 2250 may be constructed into various types depending on an interface scheme between the host device 2100 and the data storage device 2200. The connection terminal 2250 may be disposed on any one side of the data storage device 2200.

Figure 9:
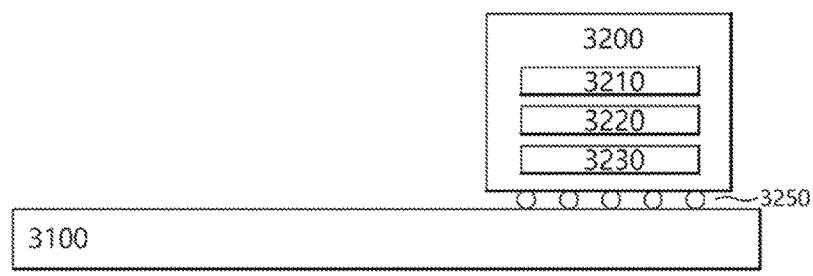
FIG. 9 is a diagram illustrating a data processing system including a data storage device in accordance with an embodiment of the present invention.

FIG. 9 is a diagram illustrating a data processing system including a data storage device in accordance with an embodiment of the present invention. Referring to FIG. 9, a data processing system 3000 may include a host device 3100 and a data storage device 3200.

The host device 3100 may be constructed in the form of a board such as a printed circuit board. Although not shown, the host device 3100 may include internal function blocks for performing the function of a host device.

The data storage device 3200 may be constructed in the form of a surface-mounting type package. The data storage device 3200 may be mounted to the host device 3100 through solder balls 3250. The data storage device 3200 may include a controller 3210, a buffer memory device 3220, and a nonvolatile memory device 3230.

The controller 3210 may control general operations of the data storage device 3200. The controller 3210 may be configured in the same manner as the controller 1210 shown in FIG. 6.

The buffer memory device 3220 may temporarily store data to be stored in the nonvolatile memory device 3230. Further, the buffer memory device 3220 may temporarily store the data read out from the nonvolatile memory device 3230. The data temporarily stored in the buffer memory device 3220 may be transmitted to the host device 3100 or the nonvolatile memory device 3230 according to control of the controller 3210.

The nonvolatile memory device 3230 may be used as the storage medium of the data storage device 3200.

Figure 10:
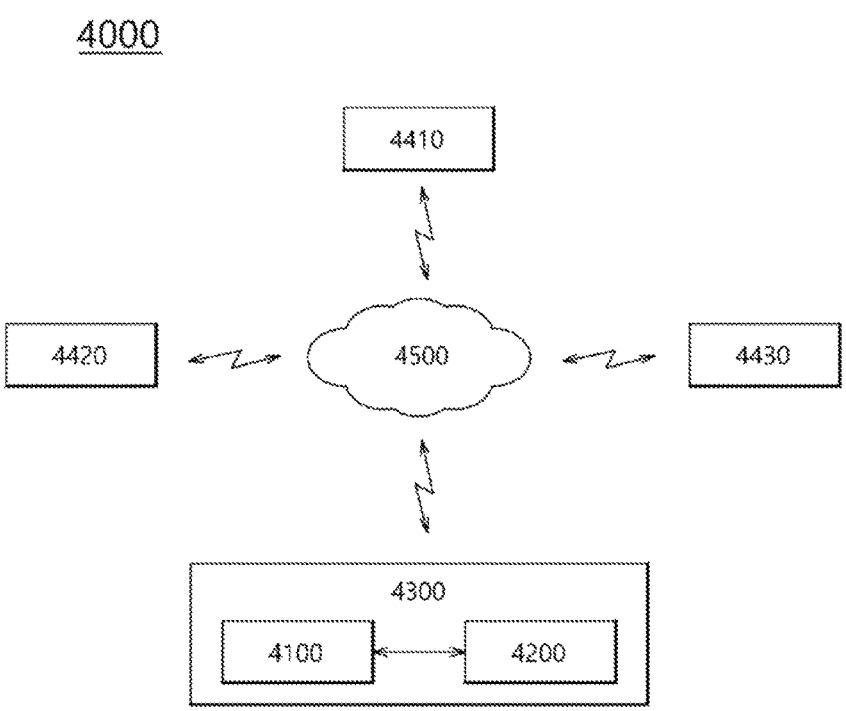
FIG. 10 is a diagram illustrating a network system including a data storage device in accordance with an embodiment of the present invention.

FIG. 10 is a diagram illustrating a network system including a data storage device in accordance with an embodiment of the present invention. Referring to FIG. 10, a network system 4000 may include a server system 4300 and a plurality of client systems 4410 to 4430 which are coupled through a network 4500.

The server system 4300 may service data in response to requests from the plurality of client systems 4410 to 4430. For example, the server system 4300 may store the data provided from the plurality of client systems 4410 to 4430. For another example, the server system 4300 may provide data to the plurality of client systems 4410 to 4430.

The server system 4300 may include a host device 4100 and a data storage device 4200. The data storage device 4200 may be constructed by the data storage device 100 shown in FIG. 1, the data storage device 1200 shown in FIG. 6, the data storage device 2200 shown in FIG. 8 or the data storage device 3200 shown in FIG. 9.

Figure 11:
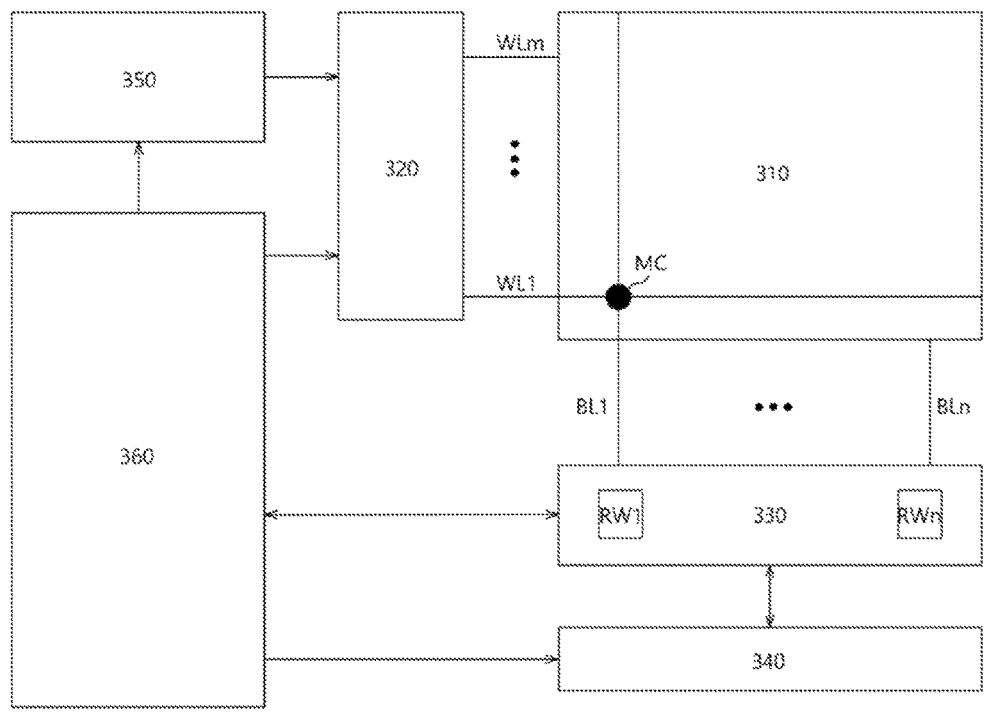
FIG. 11 is a block diagram illustrating a nonvolatile memory device included in a data storage device in accordance with an embodiment of the present invention.

FIG. 11 is a block diagram illustrating a nonvolatile memory device included in a data storage device in accordance with an embodiment of the present invention. Referring to FIG. 11, a nonvolatile memory device 300 may include a memory cell array 310, a row decoder 320, a data read/write block 330, a column decoder 340, a voltage generator 350, and a control logic 360.

The memory cell array 310 may include memory cells MC which are arranged at areas where word lines WL1 to WLm and bit lines BL1 to BLn intersect with each other.

The row decoder 320 may be coupled with the memory cell array 310 through the word lines WL1 to WLm and select lines, e.g. drain select lines and source select lines (not shown). The row decoder 320 may operate according to control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 330 may be coupled with the memory cell array 310 through the bit lines BL1 to BLn. The data read/write block 330 may include read/write circuits RW1 to RWn respectively corresponding to the bit lines BL1 to BLn. The data read/write block 330 may operate according to control of the control logic 360. The data read/write block 330 may operate as a write driver or a sense amplifier according to an operation mode. For example, the data read/write block 330 may operate as a write driver which stores data provided from the external device, in the memory cell array 310 in a write operation. For another example, the data read/write block 330 may operate as a sense amplifier which reads out data from the memory cell array 310 in a read operation.

The column decoder 340 may operate according to control of the control logic 360. The column decoder 340 may decode an address provided from the external device. The column decoder 340 may couple the read/write circuits RW1 to RWn of the data read/write block 330 respectively corresponding to the bit lines BL1 to BLn with data input/output lines (or data input/output buffers), based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the nonvolatile memory device 300, based on control signals provided from the external device. For example, the control logic 360 may control operations of the nonvolatile memory device 300 such as read, write and erase operations of the nonvolatile memory device 300.

While various embodiments have been described above, it will be understood to those skilled in the art that the embodiments described are examples only. Accordingly, the data storage device and the operating method thereof described herein should not be limited based on the described embodiments.

What is claimed is:

1. A data storage device comprising:
   a nonvolatile memory device;
   a voltage detector suitable for detecting an operating voltage of the nonvolatile memory device; and
   a control unit suitable for making a first determination whether the operating voltage is dropped intentionally or unintentionally based on a first reference time and an elapsed time for which the operating voltage decreases from a first reference voltage to a second reference voltage.

2. The data storage device according to claim 1, wherein the control unit determines that the operating voltage is intentionally dropped in the case where the elapsed time is shorter than the first reference time.

3. The data storage device according to claim 2, wherein the control unit makes a second determination whether the operating voltage is dropped intentionally or unintentionally based on a second reference time and a holding time for which the operating voltage is kept equal to or lower than the second reference voltage.

4. The data storage device according to claim 3, wherein the control unit determines that the operating voltage is intentionally dropped in the case where the holding time is longer than the second reference time.

5. The data storage device according to claim 4, wherein the control unit initializes the nonvolatile memory device after the operating voltage is stabilized to be equal to or higher than the first reference voltage.

6. The data storage device according to claim 3, wherein the control unit determines that the operating voltage is unintentionally dropped in the case where the holding time is shorter than the second reference time.

7. The data storage device according to claim 1, wherein the control unit determines that the operating voltage is unintentionally dropped in the case where the elapsed time is longer than the first reference time.

8. The data storage device according to claim 7, wherein the control unit notifies a host device that the operating voltage is dropped, initializes the nonvolatile memory device according to an initialization command or an initialization signal provided from the host device, and is provided again with a request which is uncompleted, from the host device.

9. The data storage device according to claim 7, wherein the control unit initializes the nonvolatile memory device, and reprocesses a request from the host device, which is unprocessed.

10. The data storage device according to claim 1, wherein the control unit comprises a timer which measures the elapsed time.

11. A method for operating a data storage device which stores data in a nonvolatile memory device, the method comprising:
   determining whether an operating voltage of the nonvolatile memory device is dropped to be equal to or lower than a first reference voltage;
   determining, in the case where the operating voltage is dropped to be equal to or lower than the first reference voltage, whether the operating voltage is dropped to be equal to or lower than a second reference voltage;
   determining, in the case where the operating voltage exceeds the second reference voltage, whether an elapsed time for which the operating voltage is dropped from the first reference voltage to the second reference voltage is shorter than a first reference time;

determining, in the case where the elapsed time is shorter than the first reference time, whether a holding time for which the operating voltage is held equal to or lower than the second reference voltage is longer than a second reference time; and determining, in the case where the holding time is longer than the second reference time, that the operating voltage is intentionally dropped.

12. The method according to claim 11, further comprising, in the case where it is determined that the operating voltage is intentionally dropped:

stabilizing the operating voltage to be equal to or higher than the first reference voltage; and initializing the nonvolatile memory device.

13. The method according to claim 11, further comprising determining, in the case where the elapsed time is longer than the first reference time, that the operating voltage is unintentionally dropped.

14. The method according to claim 13, further comprising, in the case where it is determined that the operating voltage is unintentionally dropped, notifying a host device that the operating voltage is dropped;

initializing the nonvolatile memory device according to an initialization command or an initialization signal provided from the host device; and receiving a request from the host device, which is uncompleted.

15. The method according to claim 13, further comprising, in the case where it is determined that the operating voltage is unintentionally dropped;

initializing the nonvolatile memory device; and reprocessing a request from the host device, which is unprocessed without involvement of the host device.

16. The method according to claim 11, further comprising determining, in the case where the holding time is shorter than the second reference time, that the operating voltage is unintentionally dropped.

* * * * *